(12) United States Patent
Redaelli et al.

(10) Patent No.: US 9,620,710 B2
(45) Date of Patent: Apr. 11, 2017

(54) SELF-SELECTING PCM DEVICE NOT REQUIRING A DEDICATED SELECTOR TRANSISTOR

(71) Applicant: Micron Technology, Inc., Boise, ID (US)

(72) Inventors: Andrea Redaelli, Calolzicorte (IT); Agostino Pirovano, Milan (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/497,073

(22) Filed: Sep. 25, 2014

(65) Prior Publication Data

US 2015/0008387 A1    Jan. 8, 2015

Related U.S. Application Data

(63) Continuation of application No. 12/651,097, filed on Dec. 31, 2009, now Pat. No. 8,847,186.

(51) Int. Cl.
| | |
|---|---|
| *H01L 47/00* | (2006.01) |
| *H01L 45/00* | (2006.01) |
| *H01L 27/24* | (2006.01) |
| *H01L 29/861* | (2006.01) |

(52) U.S. Cl.
CPC ........ *H01L 45/122* (2013.01); *H01L 27/2409* (2013.01); *H01L 45/06* (2013.01); *H01L 45/126* (2013.01); *H01L 45/144* (2013.01); *H01L 45/145* (2013.01); *G11C 2213/72* (2013.01); *G11C 2213/73* (2013.01); *H01L 29/8615* (2013.01)

(58) Field of Classification Search
CPC ............ H01L 45/122; H01L 21/02565; H01L 27/2463
USPC .......................................................... 257/2
See application file for complete search history.

(56) References Cited

U.S. PATENT DOCUMENTS

| | | | |
|---|---|---|---|
| 4,646,266 A | 2/1987 | Ovshinsky et al. | |
| 8,847,186 B2 | 9/2014 | Redaelli et al. | |
| 2005/0227382 A1* | 10/2005 | Hui | H01L 21/67069 438/14 |
| 2006/0131554 A1* | 6/2006 | Joung | G11C 13/0004 257/2 |
| 2006/0157680 A1* | 7/2006 | Takaura et al. | 257/3 |
| 2006/0158928 A1 | 7/2006 | Pellizzer et al. | |

(Continued)

FOREIGN PATENT DOCUMENTS

| | | |
|---|---|---|
| CN | 1790726 A | 6/2006 |
| CN | 102117884 A | 7/2011 |

(Continued)

OTHER PUBLICATIONS

"Chinese Application Serial No. 201010548105.2, Office Action mailed Mar. 18, 2014", 9 pgs.

(Continued)

*Primary Examiner* — Julia Slutsker
(74) *Attorney, Agent, or Firm* — Schwegman Lundberg & Woessner, P.A.

(57) ABSTRACT

A Zinc Oxide (ZnO) layer deposited using Atomic Layer Deposition (ALD) over a phase-change material forms a self-selected storage device. The diode formed at the ZnO/GST interface shows both rectification and storage capabilities within the PCM architecture.

16 Claims, 9 Drawing Sheets

(56) References Cited

U.S. PATENT DOCUMENTS

| | | |
|---|---|---|
| 2007/0116986 A1 | 5/2007 | Garg et al. |
| 2007/0184613 A1* | 8/2007 | Kim et al. .................... 438/257 |
| 2008/0121865 A1* | 5/2008 | Ahn et al. ......................... 257/5 |
| 2008/0197333 A1* | 8/2008 | Lung ....................... H01L 45/06 257/2 |
| 2010/0165719 A1* | 7/2010 | Pellizzer ................ G11C 11/56 365/163 |
| 2011/0155984 A1 | 6/2011 | Redaelli et al. |

FOREIGN PATENT DOCUMENTS

| | | | |
|---|---|---|---|
| JP | 2003068850 A | 3/2003 | |
| JP | 2004193499 A | 7/2004 | |
| JP | 2004349504 A | 12/2004 | |
| JP | 2005197637 A | 7/2005 | |
| JP | 2006140489 A | 6/2006 | |
| JP | 2007214565 A | 8/2007 | |
| JP | 2007220854 A | 8/2007 | |
| JP | 2007235142 A | 9/2007 | |
| JP | 2008172244 A | 7/2008 | |
| JP | 2009218259 A | 9/2009 | |
| SG | 172525 A1 | 7/2011 | |
| WO | WO/2008/012342 * | 1/2008 | ............. H01L 27/24 |

OTHER PUBLICATIONS

"Japanese Application Serial No. 2010-272982, Amendment filed Nov. 15, 2013", 4 pgs.

"Chinese Application Serial No. 201010548105.2 Response filed Jan. 14, 2015 to Non-Final Office Action mailed Oct. 28. 2014", With the English claims, 15 pgs.

"Chinese Application Serial No. 201010548105.2 Response filed Jun. 18, 2015 to Office Action mailed Apr. 3, 2015", With the English claims, 16 pgs.

"Chinese Application Serial. No. 201010548105.2, Office Action mailed Apr. 3, 2015", 8 pgs.

"Chinese Application Serial No. 201010548105.2, Office Action mailed Oct. 28, 2014", 8 pgs.

"Japanese Application Serial No. 2010-272982 Response filed Mar. 16, 2015 to Office Action mailed Nov. 18, 2014", With the English claims, 10 pgs.

"Japanese Application Serial No. 2010-272982, Office Action mailed May 18, 2015", 10 pgs.

"Japanese Application Serial No. 2010-272982, Office Action mailed Oct. 15, 2014", 8 pgs.

"Japanese Application Serial No. 2010-272982, Response filed Aug. 18, 2015 to Office Action mailed May 18, 2015", 5 pgs.

* cited by examiner

SELF-SELECTING PCM DEVICE NOT REQUIRING A DEDICATED SELECTOR TRANSISTOR

BACKGROUND OF THE INVENTION

Floating gate memories are self selected devices where the selecting functions and the storage functions are realized in a unique device. However, this type of nonvolatile memory is being replaced by Phase Change Memory (PCM) for the next generation due to favorable write speeds, smaller cell sizes, simpler circuitries and a fabrication compatibility with the Complementary Metal-Oxide-Semiconductor (CMOS) process. Current PCM uses a dedicated selection device, usually a MOS or a BJT transistor, to select the memory cell for reading and writing. The selection device requires additional masks and process complexity, and therefore, improvements are needed in the selection device for selecting the memory cell.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

It should be understood that the terms "coupled" and "connected", along with their derivatives, are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

Figure 1:
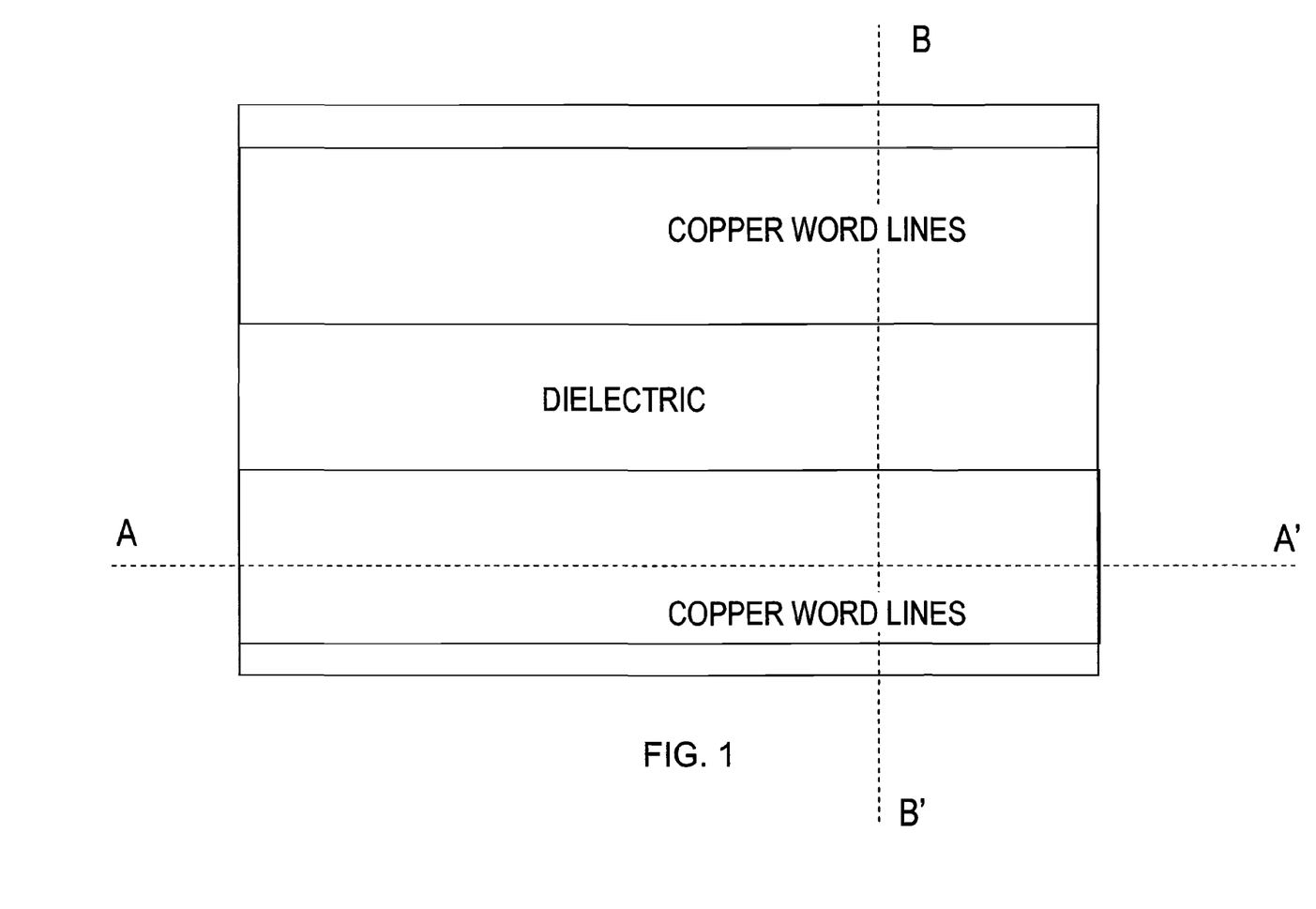
FIG. 1 shows a storage device that illustrates a first view A-A' and a second view B-B'.
Figure 2:
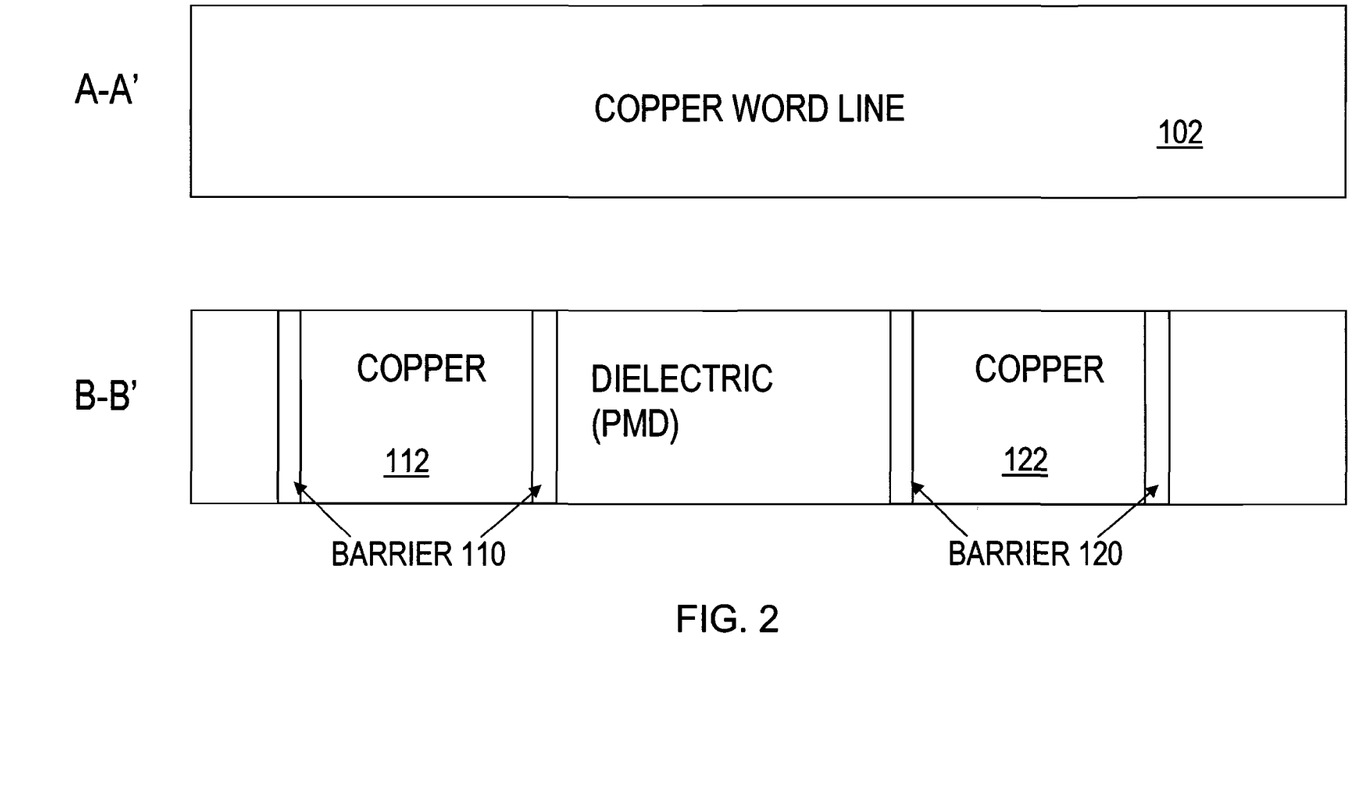
FIG. 2 is a view along a A-A' axis of a deposited copper word line and other word lines as viewed along the B-B' axis.

FIG. 1 shows a top view of a storage device that illustrates a first view along the A-A' axis and a second orthogonal view along the B-B' axis. These two views are used in FIGS. 2-6 to show the fabrication compatibility that places PCM devices into the Complementary Metal-Oxide-Semiconductor (CMOS) process. Specifically, FIG. 2 is a side view along the A-A' axis and the B-B' axis that shows a deposited copper word line. Note that these views illustrate an initial process step in the fabrication of the PCM storage elements that follow the CMOS process that fabricates CMOS logic gates.

Figure 3:
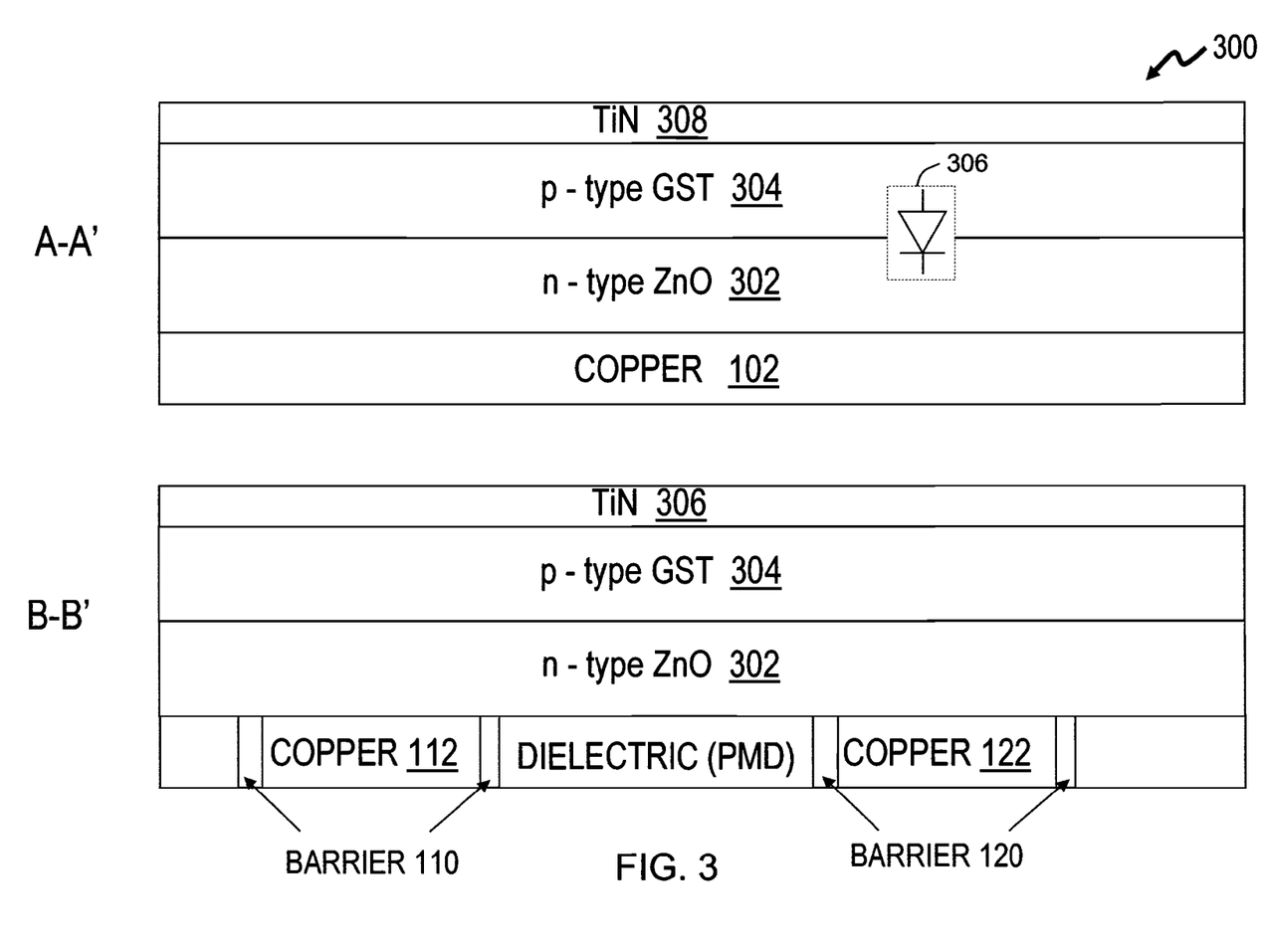
FIG. 3 illustrates a cross-sectional view of a stack of deposited materials that include n-type ZnO, p-type GST, and TiN in accordance with the present invention as viewed along the A-A' axis and the B-B' axis.

FIG. 3 illustrates a cross-sectional view along the A-A' axis and the B-B' axis of deposited materials stacked with n-type ZnO 302, p-type GST 304, and TiN 308 in accordance with the present invention. The figure shows a self-heated PCM storage device 300 fabricated having a Ge—Sb—Te (GST) material 304 deposited directly on top of a Zinc Oxide (ZnO) layer 302 without losing the storage capability of the GST material. The stack forms a heterojunction diode 306 at the junction of the p-type GST material 304 with the n-type ZnO layer.

Using a manufacturing process as shown in FIG. 3, a system memory with phase change materials may be fabricated that exhibits phase transitions due to changes in temperature. By including the alloys of elements of group VI of the periodic table, referred to as chalcogenides or chalcogenic materials, the memory cells may be programmed by resistive heating with current pulses that transition the memory cell between a high resistance state (an amorphous phase, reset state) and a low resistance state (a crystalline phase, set state). Thus, chalcogenides may be used advantageously in the illustrated process to provide data retention in phase change memory cells that remain stable even after the power is removed from the nonvolatile memory.

In the CMOS/PCM manufacturing process the ZnO coating may be deposited using Atomic Layer Deposition (ALD) which provides a film growth that is self-limiting based on surface reactions that make atomic scale deposition control possible. During fabrication this coating process introduces into a process chamber a gas that deposits a monolayer on the wafer surface. A second gas introduced into the chamber reacts with the first precursor to produce a monolayer of film on the substrate whose layer thickness is precisely controlled by the number of deposition cycles. Thus, the ALD process may be carried out at relatively low temperatures and provide Angstrom-level thickness control with super-conformal films that are pinhole-free.

As previously mentioned, by processing the GST layer 304 to be in contact with the ZnO layer 302, the interface forms a GST/ZnO heterojunction. The crystalline GST material 304 is naturally p-type and the ZnO material 302 is n-type, with the resulting diode 306 having good rectifying properties. Diode 306 may be employed for selecting the GST memory cell storage element which eliminates the use of a dedicated selection transistor for each memory cell in the PCM array. Thus, depositing p-type crystalline GST layer 304 directly above the n-type Zinc Oxide (ZnO) layer 302 forms a GST/ZnO junction embedded in the PCM storage element, and the formed diode reduces the stack and the subsequent process complexity, also saving a number of masks related to the selection device fabrication.

Figure 4:
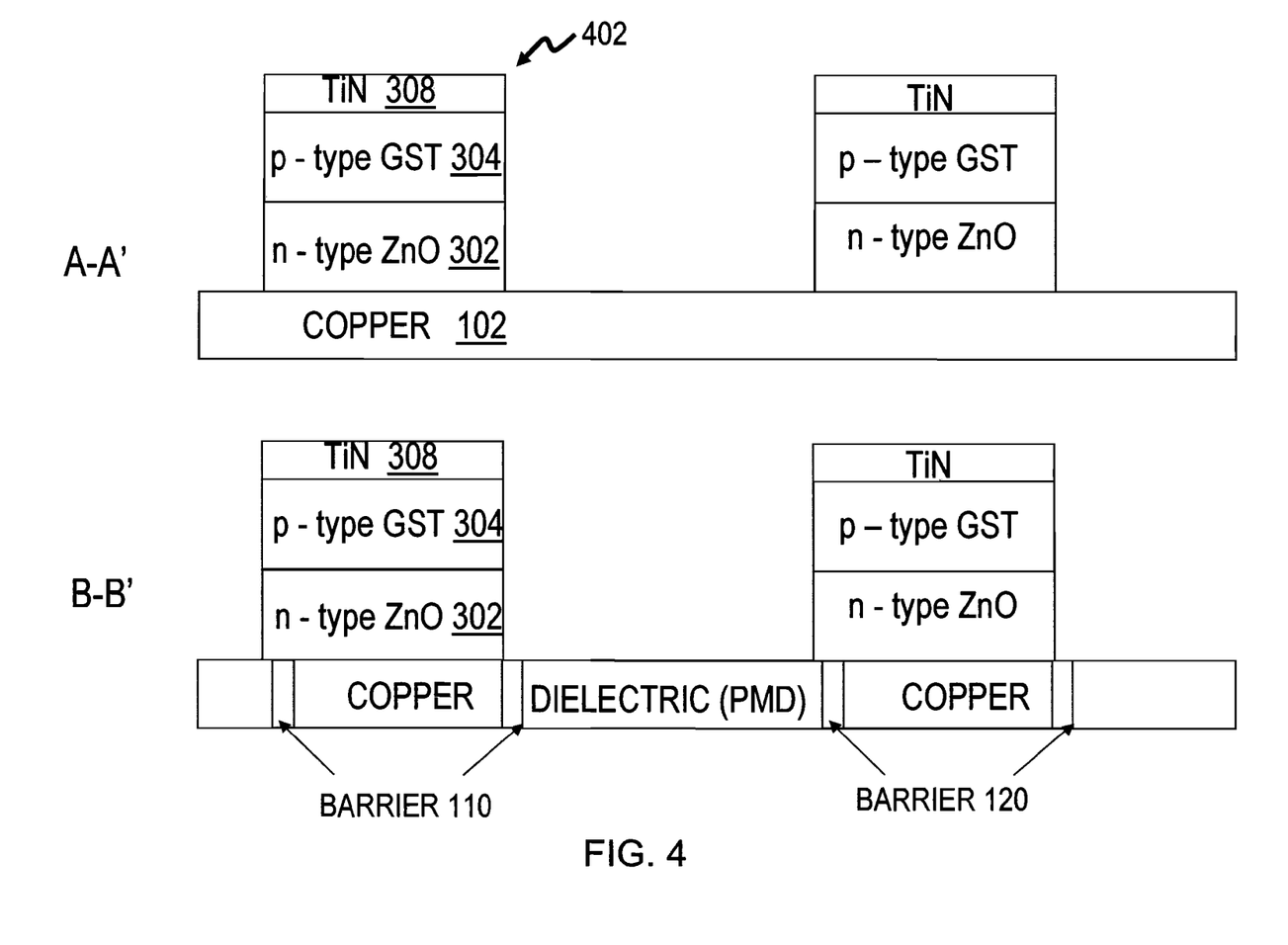
FIG. 4 illustrates a cross-section of a dot defined for a PCM memory storage device fabricated with Zinc Oxide (ZnO) that is deposited with an Atomic Layer Deposition (ALD) process adjacent to GST material in accordance with the present invention.
Figure 5:
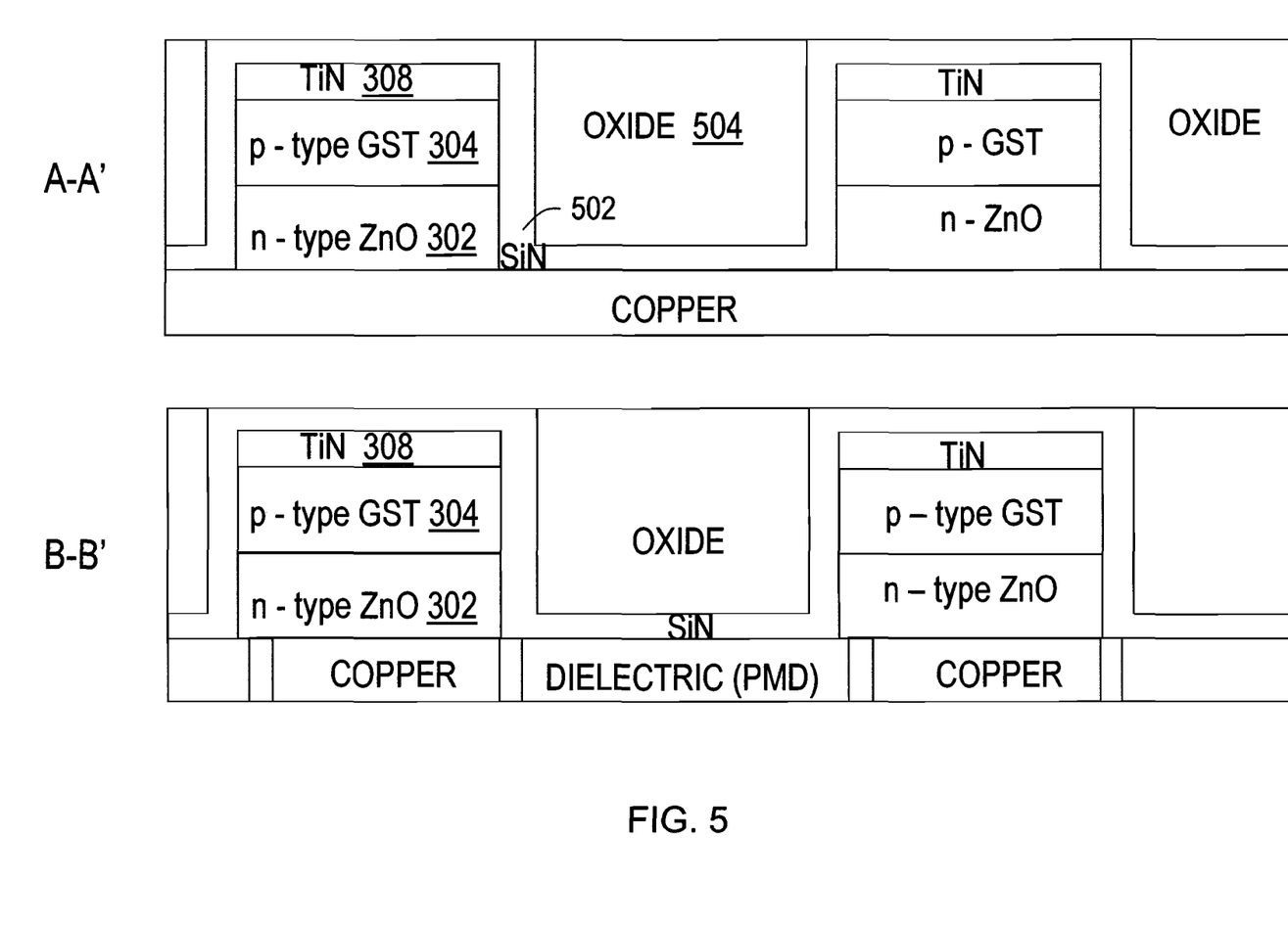
FIG. 5 illustrates cell sealing and dielectrics filling following deposition of the stack in accordance with the present invention.
Figure 6:
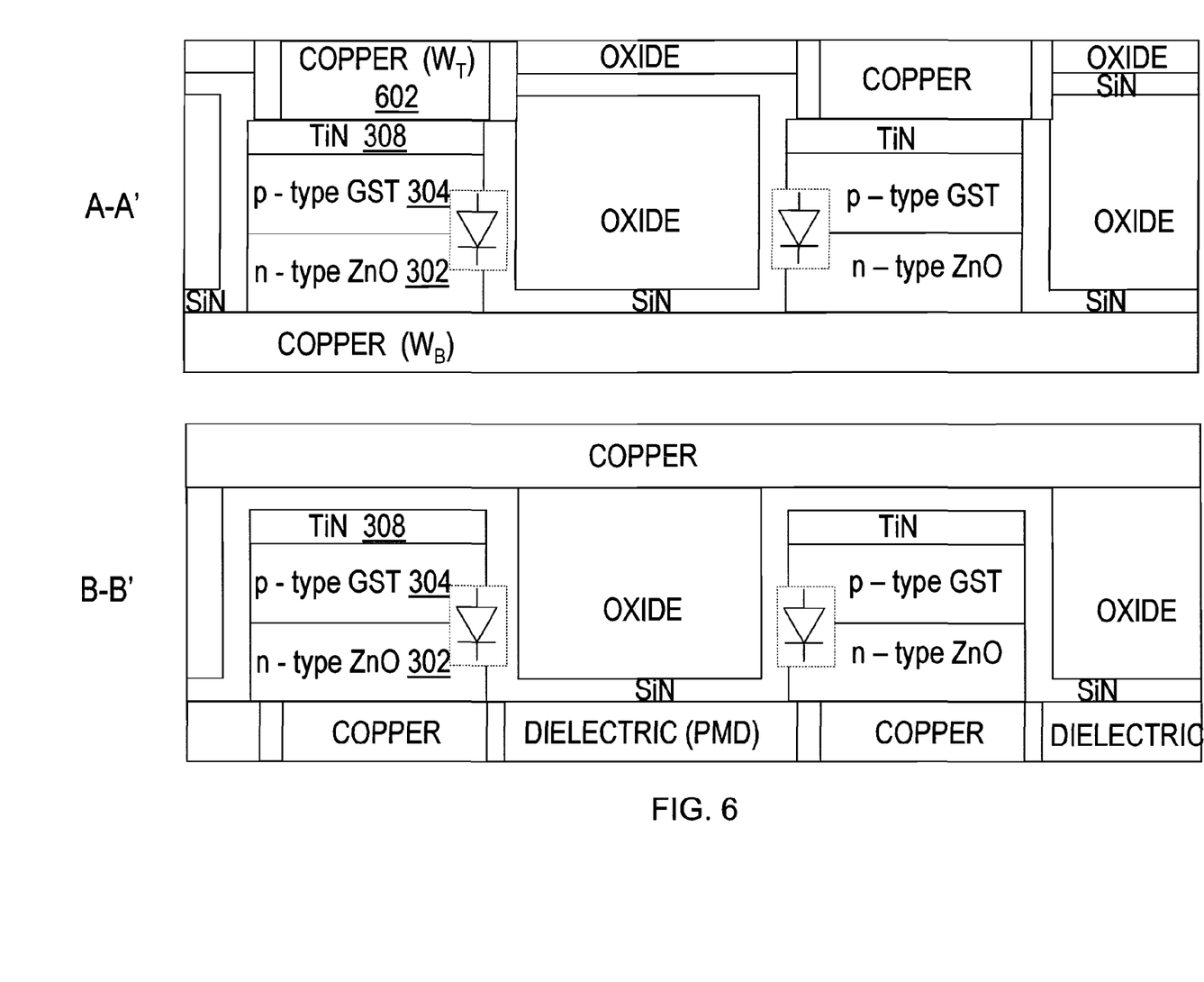
FIG. 6 illustrates bitline formation and definition in accordance with the present invention.

FIG. 4 illustrates a cross-section of a dot 402 defined for the self-heated PCM storage device 300 fabricated with a p-type GST material 304 adjacent to the n-type ZnO material 302. FIG. 5 illustrates cell sealing SiN 502 and dielectrics filling 504 following deposition of the stack in accordance with the present invention. FIG. 6 illustrates the bitline 602 formation and definition. A positive bias applied to a top contact ($W_T$) with respect to the bottom contact ($W_B$) turns on the selector device.

Figure 7:
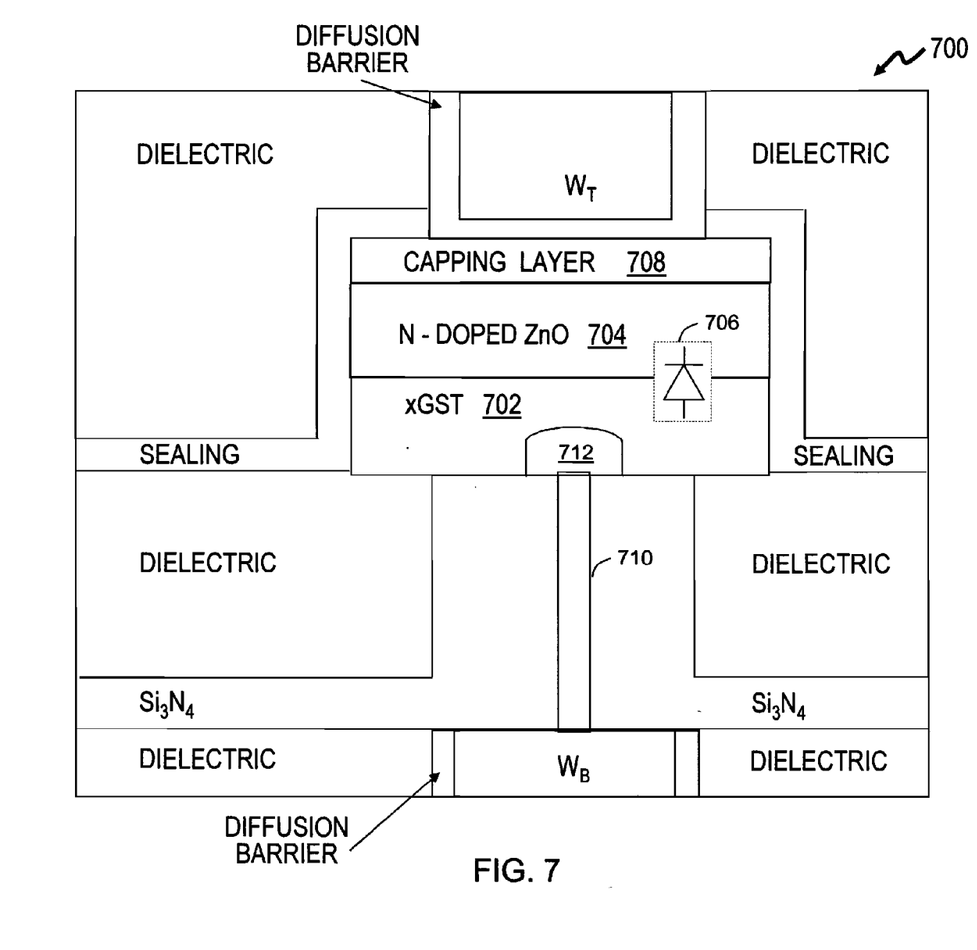
FIG. 7 illustrates lance heater definition in a PCM architecture in accordance with the present invention.
Figure 8:
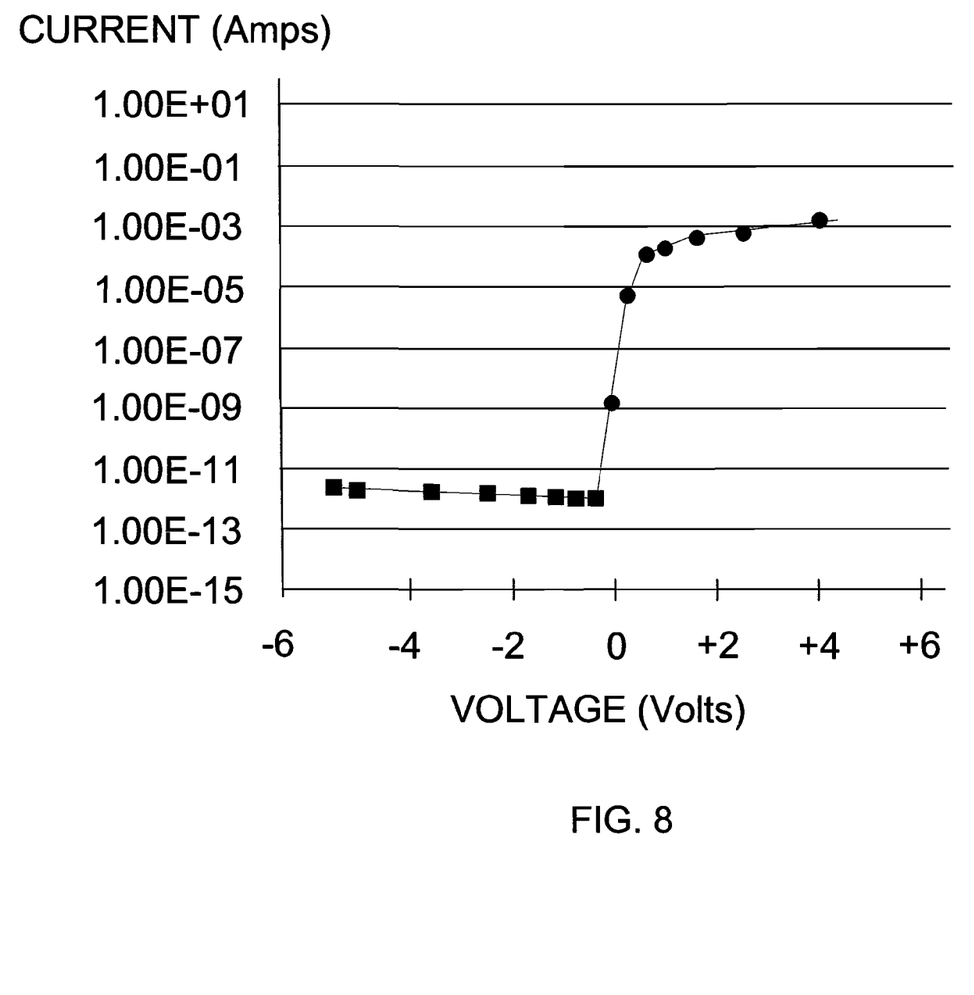
FIG. 8 shows the I-V electrical characteristics of the GST/ZnO heterojunction for the embodiment of a memory device that utilizes the heater element illustrated in FIG. 7.

FIG. 7 illustrates an embodiment of a PCM storage device 700 having a heater 710 and a GST dot region 712 that is involved in the phase change. An n-type ZnO layer 704 covers the GST layer 702 to form a PN junction. It should be noted that a lance-based cell is described, but other PCM cell architectures such as for example, a wall device, a pore device, or a Trench device may incorporate features of the present invention. Thus, other PCM cell architectures may deposit a ZnO layer 704 and a capping layer 708 after the deposition of GST layer 702, where the whole stack is subsequently etched. The GST dot region 712 is formed close to the heater element and is involved in the phase change and is also part of the rectifying junction constituted by GST layer 702 and ZnO layer 704. It should be clear that GST layer 702 is simultaneously part of both the selection and the storage element, thus realizing a self-selected device:

FIG. 8 provides the I-V electrical characteristics of the p-type GST layer and the n-type ZnO heterojunction. The electrical properties of the junction are illustrated for a ground potential applied to the ZnO layer 704 and a positive voltage applied to GST layer 702, and also for a negative voltage applied to the GST layer to reverse bias the junction. The voltage on the X-axis is the difference between the bottom contact voltage and the top contact voltage. A ratio of an "on" current to an "off" current as designated by Ion/Ioff has a value of approximately 109 for a diode with an area of 100 nm×100 nm and an "Ion" current of 1 mA biased at 3 volts. The data for the current Ion/Ioff is provided as one example and other ratios may be used without limiting the claimed subject matter.

Figure 9:
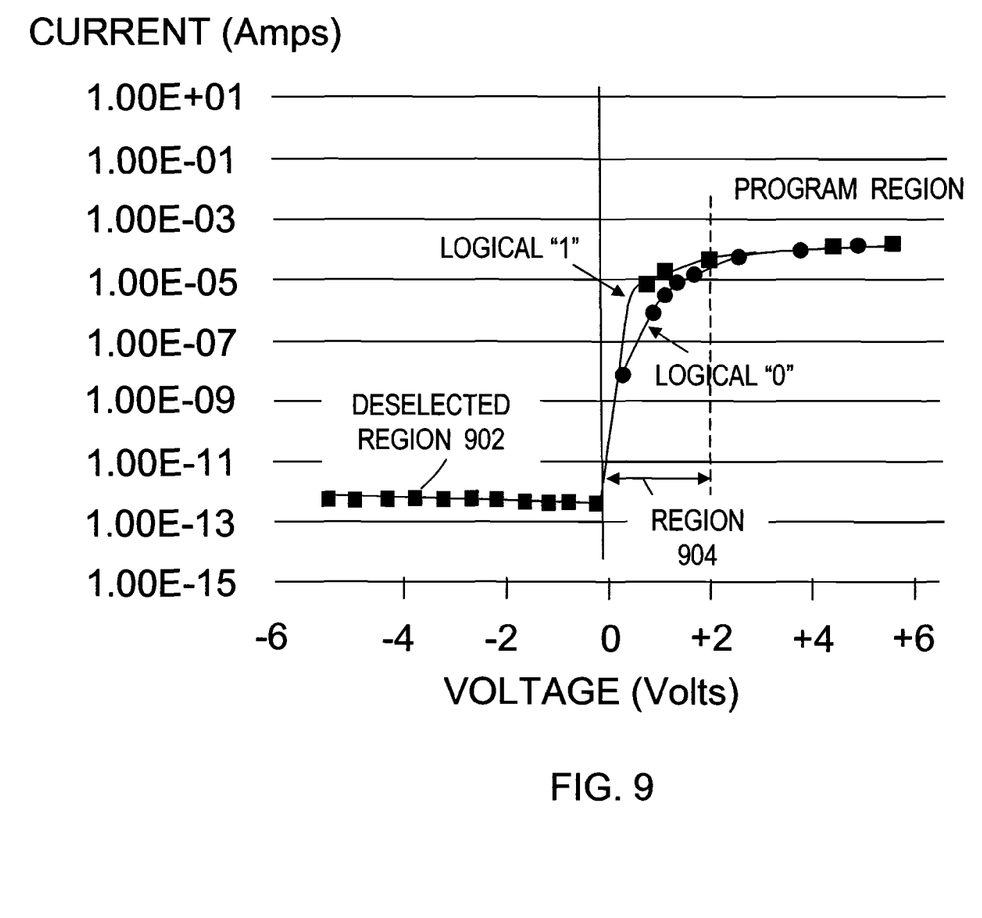
FIG. 9 shows the I-V electrical characteristics for the self selected device, showing a deselected region and a selection region for detecting a resistance of the memory device.

FIG. 9 describes the I-V electrical characteristics for the self selected device. With the diode that is formed at the GST/ZnO junction reversed biased, both of the states of PCM storage device 700 are deselected as described by deselected region 902. With a positive voltage supplied to forward bias the diode below a two volt limit (defined by region 904), the two states of PCM storage device 700 may be detected by reading the resistance of the device. It is anticipated that the positive bias voltage of two volts described as a limit may be adjusted. Also note that the electrical characteristics of diode 706 overlap in the programming region when the biasing voltage is above the two volt limit.

By now it should be apparent that a phase-change material GST deposited adjacent to a ZnO layer form a self-selected storage device. The diode formed at the ZnO/GST interface clearly shows both rectification and storage capabilities within this PCM architecture.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A storage device comprising:
   a first conductive word line;
   a second conductive word line;
   a dielectric between the first and second conductive word lines;
   a first barrier between the first conductive word line and the dielectric and contacting the first conductive word line and the dielectric;
   a second barrier between the second conductive word line and the dielectric and contacting the second conductive word line and the dielectric;
   a first memory cell having an oxide-based material in contact with a phase change memory (PCM) material to form a diode junction in the PCM material, the oxide-based material contacting the first conductive word line, the PCM material of the first memory cell forming a first storage element;
   a first material arranged in a first stack with the oxide-based material and the PCM material of the first memory cell;
   a second memory cell having an oxide-based material in contact with a PCM material to form a diode junction in the PCM material, the oxide-based material contacting the second conductive word line, the PCM material of the second memory cell forming a second storage element;
   a second material arranged in a second stack with the oxide-based material and the PCM material of the second memory cell;
   a trench including a bottom over the dielectric, a first side wall adjacent the first stack, and a second side wall adjacent the second stack;
   a first additional dielectric in the trench and conforming to the bottom and first and second side walls of the trench; and
   second additional dielectric in the trench and in between a portion of the first additional on the first side wall and a portion of the first additional on the second side wall, the first and second additional dielectrics having different materials.

2. The storage device of claim 1, wherein the oxide-based material of the first memory cell has an n-type conductivity, and the phase change material of the first memory cell has an p-type conductivity.

3. The storage device of claim 2, wherein the oxide-based material of the second memory cell has an n-type conductivity, and the phase change material of the second memory cell has an p-type conductivity.

4. The storage device of claim 1, wherein the oxide-based material includes zinc oxide and the PCM includes chalcogenide material.

5. A storage device comprising:
   a first conductive word line;
   a second conductive word line;
   a dielectric between the first and second conductive word lines;

a first barrier between the first conductive word line and the dielectric and contacting the first conductive word line and the dielectric;

a second barrier between the second conductive word line and the dielectric and contacting the second conductive word line and the dielectric;

a first memory cell contacting the first conductive word line, the first memory cell including a first semiconductor material and a first phase change material contacting and arranged in a first stack with the first semiconductor material to form a diode junction in the first phase change material, the first semiconductor material having a first conductivity type, and the first phase change material having a second conductivity type and forming a first storage element;

a second memory cell contacting the second conductive word line, the second memory cell including a second semiconductor material and a second phase change material contacting and arranged in a second stack with the second semiconductor material to form a diode junction in the second phase change material, the second semiconductor material having the first conductivity type, and the second phase change material having the second conductivity type and forming a second storage element;

a trench including a bottom over the dielectric, a first side wall adjacent the first stack, and a second side wall adjacent the second stack;

a first additional dielectric in the trench and conforming to the bottom and first and second side walls of the trench; and second additional dielectric in the trench and in between a portion of the first additional on the first side wall and a portion of the first additional on the second side wall, the first and second additional dielectrics having different materials.

6. The storage device of claim 5, wherein the first conductivity type includes an n-type conductivity, and the second conductivity type includes a p-type conductivity.

7. A storage device comprising:
a first conductive word line;
a second conductive word line;
a dielectric between the first and second conductive word lines;
a first barrier between the first conductive word line and the dielectric and contacting the first conductive word line and the dielectric;
a second barrier between the second conductive word line and the dielectric and contacting the second conductive word line and the dielectric;
a first memory cell contacting the first conductive word line, the first memory cell including a first oxide-based material and a first phase change material contacting and arranged in a first stack with the first oxide-based material to form a diode junction in the first phase change material, the first phase change material forming a first storage element;
a second memory cell contacting the second conductive word line, the second memory cell including a second oxide-based material and a second phase change material contacting and arranged in a second stack with the second oxide-based material to form a diode junction in the second phase change material, the second phase change material forming a first storage element;
a trench including a bottom over the dielectric, a first side wall adjacent the first stack, and a second side wall adjacent the second stack;
a first additional dielectric in the trench and conforming to the bottom and first and second side walls of the trench; and
second additional dielectric in the trench and in between a portion of the first additional on the first side wall and a portion of the first additional on the second side wall, the first and second additional dielectrics having different materials.

8. The storage device of claim 7, wherein the first oxide-based material and the first phase change material have different conductivity types.

9. The storage device of claim 8, wherein the second oxide-based material and the second phase change material have different conductivity types.

10. The storage device of claim 7, wherein the first oxide-based material includes zinc oxide.

11. The storage device of claim 10, wherein the first phase change material includes chalcogenide material.

12. The storage device of claim 11, wherein the second oxide-based material includes zinc oxide.

13. The storage device of claim 12, wherein the second phase change material includes chalcogenide material.

14. The storage device of claim 7, further comprising:
a first material arranged in the first stack with the first oxide-based material and the first phase change material; and
a second material arranged in the second stack with the second oxide-based material and the second phase change material.

15. The storage device of claim 14, wherein the first material includes titanium nitride.

16. The storage device of claim 15, wherein the second material includes titanium nitride.

* * * * *